United States Patent
Hsu et al.

(10) Patent No.: US 7,099,788 B2
(45) Date of Patent: Aug. 29, 2006

(54) MULTIPHASE WAVEFORM GENERATOR CAPABLE OF PERFORMING PHASE CALIBRATION AND RELATED PHASE CALIBRATION METHOD

(75) Inventors: Tse-Hsiang Hsu, Hsin-Chu (TW); Wei-Hsuan Tu, Taipei (TW)

(73) Assignee: Mediatek Incorporation, Hsin-Chu Hsien (TW)

( * ) Notice: Subject to any disclaimer, the term of this patent is extended or adjusted under 35 U.S.C. 154(b) by 0 days.

(21) Appl. No.: 10/908,147

(22) Filed: Apr. 28, 2005

(65) Prior Publication Data

US 2005/0246141 A1    Nov. 3, 2005

(30) Foreign Application Priority Data

Apr. 30, 2004    (TW)    ................................. 93112121 A

(51) Int. Cl.
    *G01R 13/00*    (2006.01)
(52) U.S. Cl. ....................................................... 702/66
(58) Field of Classification Search ................... 702/66
    See application file for complete search history.

(56) References Cited

U.S. PATENT DOCUMENTS

| | | | | |
|---|---|---|---|---|
| 2003/0200518 A1* | 10/2003 | Saeki | ............................. | 716/6 |
| 2004/0080349 A1* | 4/2004 | Kawahito et al. | ............ | 327/158 |
| 2004/0081053 A1* | 4/2004 | Kojima | ..................... | 369/59.11 |
| 2004/0257949 A1* | 12/2004 | Hsu et al. | ................... | 369/59.2 |
| 2006/0045222 A1* | 3/2006 | Kim et al. | ................... | 375/354 |

* cited by examiner

*Primary Examiner*—John Barlow
*Assistant Examiner*—Demetrius Pretlow
(74) *Attorney, Agent, or Firm*—Winston Hsu

(57) ABSTRACT

The present invention discloses a multiphase waveform generator capable of performing phase calibration, and a related phase calibration method. The disclosed multiphase waveform generator includes a multiphase waveform generating module and a calibrating module. The multiphase waveform generating module receives an input signal and shifts edges of the input signal by a delay time according to a delay parameter to generate a phase-modified signal. The calibrating module is coupled to the multiphase waveform generating module for calibrating the delay time to reduce a difference between a characteristic value of the phase-modified signal and an expected value, which is calculated according to the delay parameter and characteristic values of a first and a second predetermined periodic signal.

17 Claims, 6 Drawing Sheets

MULTIPHASE WAVEFORM GENERATOR CAPABLE OF PERFORMING PHASE CALIBRATION AND RELATED PHASE CALIBRATION METHOD

BACKGROUND

The present invention relates to a multiphase waveform generator, and more particularly, to a multiphase waveform generator capable of performing phase calibration and phase calibration method thereof.

The write control waveform for optical disc drives is originated from a bit sequence to be recoded onto the optical disc. Whereas different optical storage medium or data pattern usually derives to different write strategies, in which the recorder laser power is strategically shaped by shifting the falling edges of the waveform of the bit sequence so as to adjust the write time duration in order to achieve proper read characteristics. Thus a multiphase waveform generator is required to support this edge shifting capability.

FIG. 1 is a functional block diagram shows a multiphase waveform generator of the related art. A multiphase waveform generator 100 receives an input signal $S_{IN}$ and a delay parameter n, shifts edges of the input signal $S_{IN}$ by a delay time $DT_n$ according to the delay parameter n to generate a phase-modified signal $S_{OUT}$. The edges of the input signals $S_{IN}$ to be shifted can be the falling edges. On the other hand, the multiphase waveform generator 100 can also be used to shift the rising edges of the input signal $S_{IN}$. In practical, the delay parameter n could be time-variant or time-invariant. Typically, the delay parameter n is an integer from 0 to a preset number N, which means to let the delay time $DT_n = n*\Delta T$ with $\Delta T = T/N$ and T being the bit time interval. FIG. 2 shows an example. Suppose the bit sequence is 1101 in which the falling edge of the input signal $S_{IN}$ is positioned at $t_1$. The edge shift according to a delay parameter n=2 shows a delay time $DT_n = 2*\Delta T$ such that the falling edge of the phase-modified signal $S_{OUT}$ is positioned at $t_1 + 2*\Delta T$.

Please refer back to FIG. 1. The multiphase waveform generator 100 comprises a delay module 110 and a selection module 130. The delay module 110 comprises M serially connected delay units 115 which delay the input signal $S_{IN}$ and generate M+1 delayed signals, denoted by $D_0$, $D_1$, $D_2$ ..., $D_M$. Typically, M is a number much larger than N for a practical application. Note that, the delayed signal $D_0$ with zero delay time is just the input signal $S_{IN}$. The selection module 130 comprises a control signal generator 135 and a multiplexer 140. The multiplexer 140 selects one of the M+1 delayed signals ($D_0$, $D_1$, $D_2$ ..., $D_M$) according to a control signal CTRL to form the phase-modified signal $S_{OUT}$. The possible states of the control signal CTRL are denoted by $CTRL_0$, $CTRL_1$, $CTRL_2$, ..., $CTRL_M$, which instructs the multiplexer 140 to select the delayed signal $D_0$, $D_1$, $D_2$ ... $D_m$, respectively. The control signal generator 135 receives the delay parameter n and generates the control signal CTRL accordingly. As is well known in the art, the phase-modified signal $S_{OUT}$ can be formed by properly toggling the state of the control signal CTRL between $CTRL_0$ and $CTRL_K$ with K being a function of the delay parameter n. By this way, the delay time $DT_n$ will equal to the delay amount introduced by the first K delay units 115 in the delay module 110. Typically, the relationship between the K and the delay parameter n is stored in a lookup table $T_{nK}$. Conventionally, the lookup table $T_{nK}$ is identical for each integrated circuit.

Nevertheless, the actual delay amount of the delay units 115 may have some fluctuation due to various conditions, such as fabrication process or temperature. Using identical lookup table $T_{nK}$ may result in that the practical amount of the edge shift, i.e. the $DT_n$, deviates from the expected one, i.e. $n*T$.

SUMMARY OF INVENTION

It is an object of the present invention to provide a multiphase waveform generator capable of edge shifting calibration and edge shifting calibration methods thereof.

According to the preferred embodiment of the present invention, a multiphase waveform generator comprises a multiphase waveform generating module and a calibrating module as disclosed. The multiphase waveform generating module is utilized for receiving a first input signal and a delay parameter and shifting respective edges of the input signal by a delay time according to the delay parameter to generate a phase-modified signal. The calibrating module on the other hand, comprises a measuring module for receiving a second input signal, measuring a characteristic value that characterizes the position of the edges of the second input signal, and a control module electrically connected to the measuring module for calibrating the delay time to reduce a difference between a characteristic value of the phase-modified signal and an expected characteristic value.

The measuring module generates the characteristic value of the phase-modified signal using the phase-modified signal as the second input signal, the control module stores a first reference value which is generated by the measuring module using a first predetermined periodic signal as the second input signal, the control module stores a second reference value which is generated by the measuring module using a second predetermined periodic signal as the second input signal, and the expected characteristic value is calculated according to the first and second reference values, and the delay parameter.

Another aspect of the present invention includes a method for calibrating a multiphase waveform generator, in which the multiphase waveform generator is utilized for receiving an first input signal and a delay parameter, outputting a phase-modified signal having edges respectively shifted by a delay time according to the delay parameter. The method comprises following steps: providing a measuring means for receiving a second input signal and measuring a characteristic value that characterizes the position of the edges of the second input signal; generating a first reference value by letting the second input signal be a first predetermined periodic signal and measuring the characteristic value of the first predetermined periodic signal; generating a second reference value by letting the second input signal be a second predetermined periodic signal and measuring the characteristic value of the second predetermined periodic signal; determining an expected characteristic value according to the first and second reference values, and the delay parameter; measuring the characteristic value of the phase-modified signal by letting the second input signal be the phase-modified signal; and calibrating the delay time to reduce a difference between the characteristic value of the phase-modified signal and the expected characteristic value.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
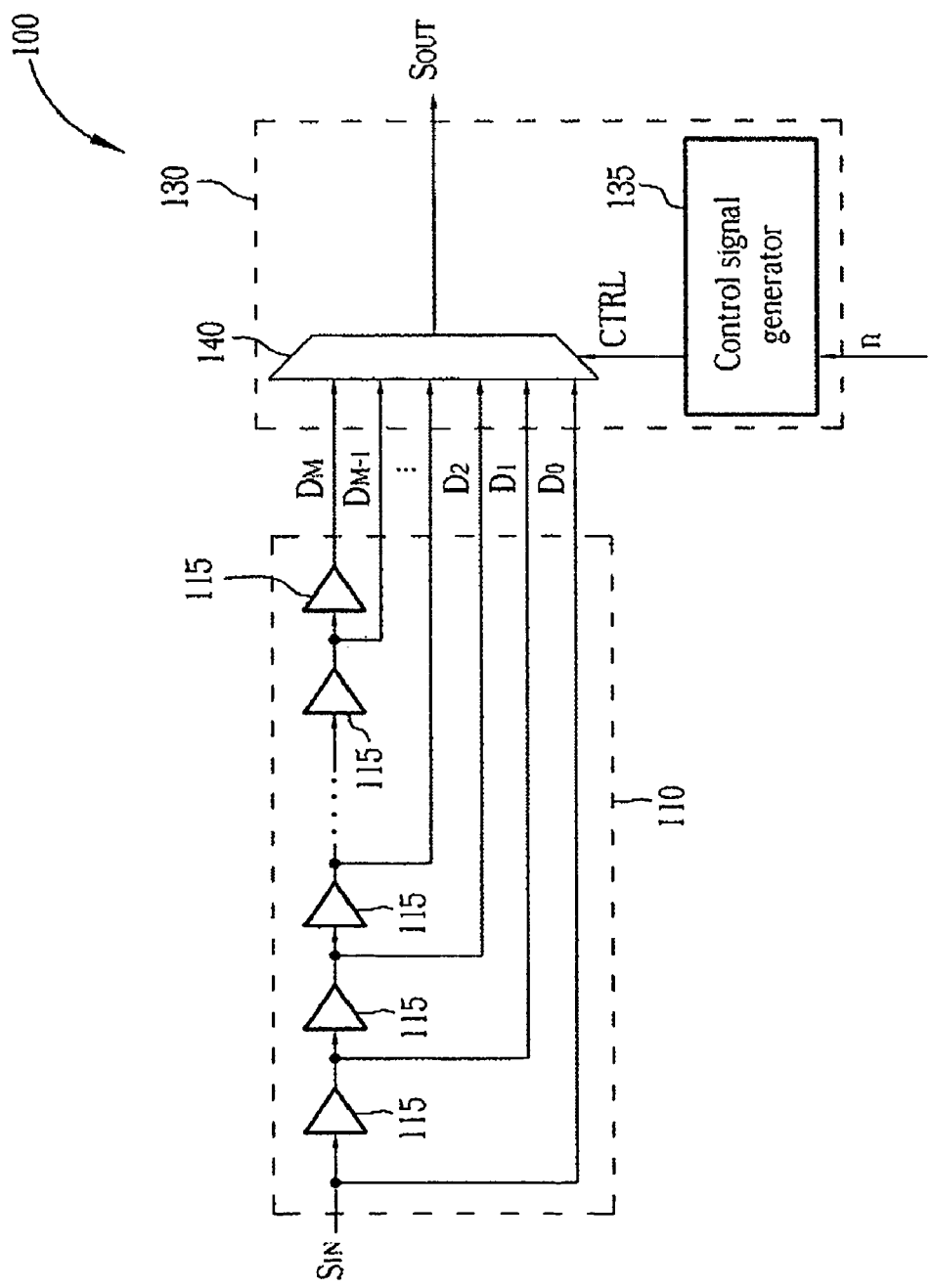
FIG. 1 is a functional block diagram showing a multiphase waveform generator according to the related art.
Figure 2:
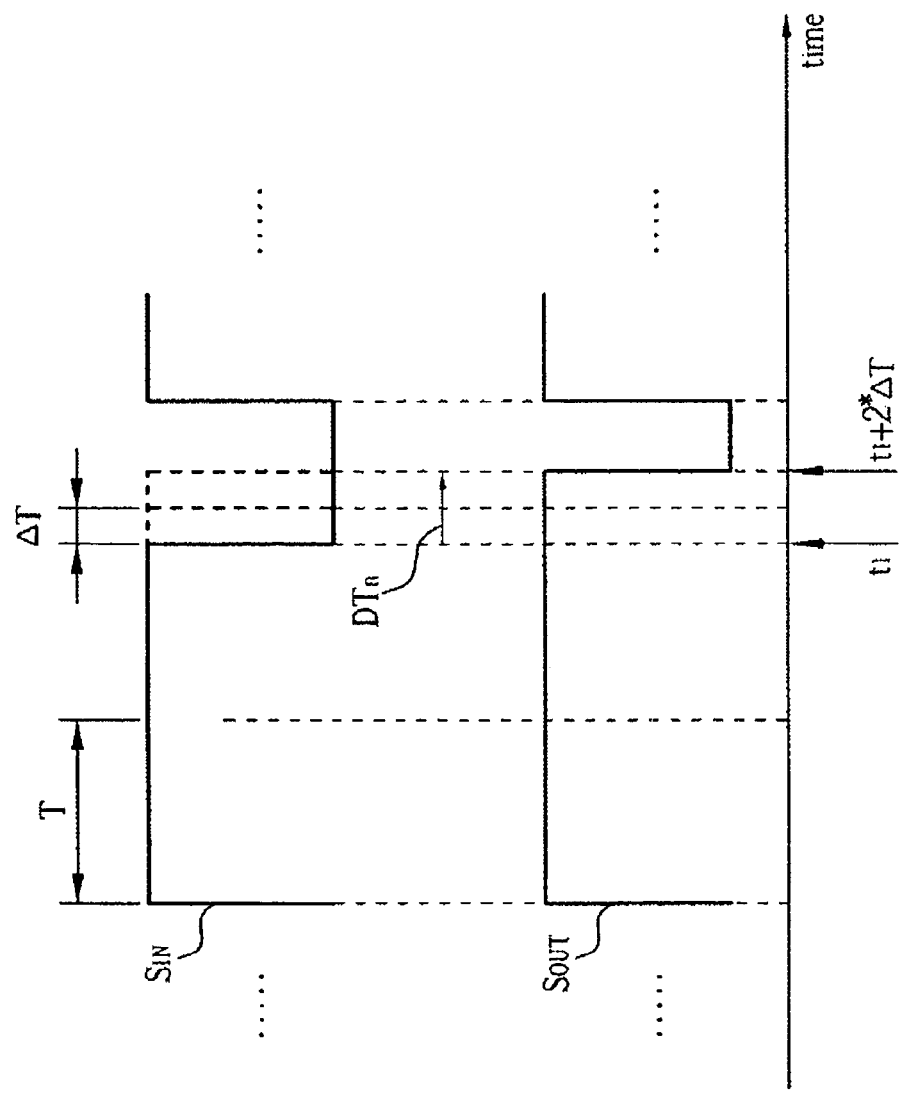
FIG. 2 is an example showing the input signal $S_{IN}$ and the phase-modified signal $S_{OUT}$ with the delay parameter n=2.
Figure 3:
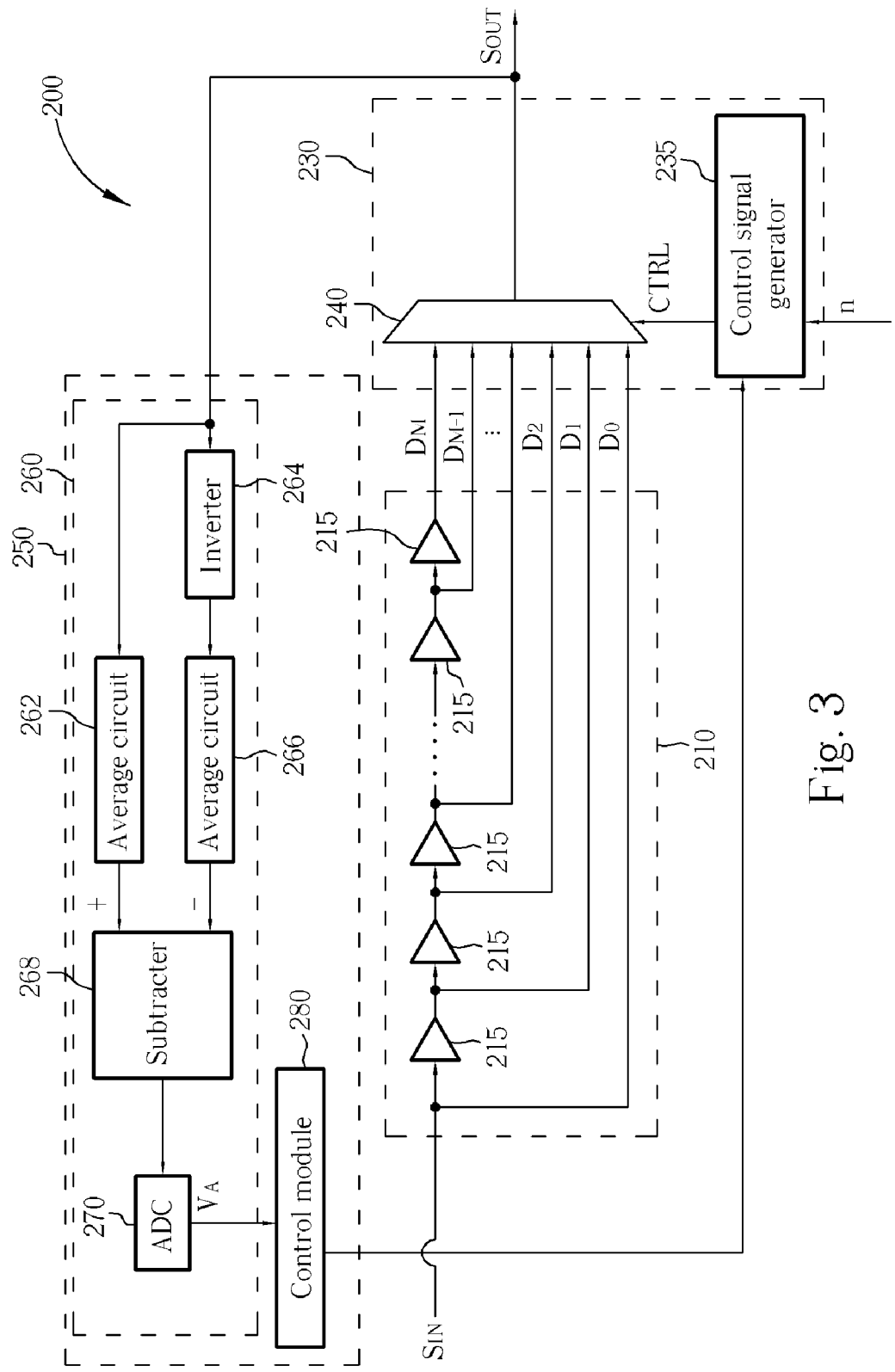
FIG. 3 is a functional block diagram showing a multiphase waveform generator capable of performing phase calibration according to the first embodiment of the present invention.

FIG. 3 is a functional block diagram of a multiphase waveform generator capable of performing phase calibration according to the first embodiment of the present invention. As shown in FIG. 3, a multiphase waveform generator 200 comprises a multiphase waveform generating module and a calibrating module 250, in which the multiphase waveform generating module includes a delay module 210 and a selection module 230. Preferably, the delay module 210 is similar to the delay module 110 of FIG. 1 and the selection module 230 is similar to the selection module 130 of FIG. 1. The difference is that the selection module 230 of FIG. 3 can be calibrated by the calibrating module 250.

The calibrating module 250 comprises a measuring module 260 and a control module 280. As shown in FIG. 3, the measuring module 260 comprises an average circuit 262 (which can be a low-pass filter), an inverter 264, another average circuit 266 (which can also be a low-pass filter), a subtracter 268, and an analog to digital converter (ADC) 270. The measuring module 260 measures a characteristic value that characterizes the position of the edges of the signal $S_{OUT}$. The control module 280 is electrically connected to the measuring module 260 for calibrating the delay time $DT_n$ based on the characteristic value of the signal $S_{OUT}$ and an expected characteristic value $V_n$.

The expected characteristic value $V_n$ is calculated according to a first reference value $V_{R1}$, a second reference value $V_{R2}$, and the delay parameter n. The first reference value $V_{R1}$ is generated by the measuring module 260 using a first predetermined periodic signal $S_1$ as its input signal, which is achieved by letting the input signal $S_{IN}$ be the first predetermined periodic signal $S_1$ and setting the delay parameter n=0. The second reference value $V_{R2}$ is generated by the measuring module 260 using a second predetermined periodic signal $S_2$ as its input signal, which is achieved by letting the input signal $S_{IN}$ be the second predetermined periodic signal $S_2$ and setting the delay parameter n=0. [Para 20]As an example, the first predetermined periodic signal $S_1$ is 100100100 . . . , whose waveform periodically has one bit duration of high signal level ($V_H$) and two bit durations of low signal level ($V_L$). According to FIG. 3, the characteristic value of the first predetermined periodic signal $S_1$, denoted by $V_{R1}$, should be $(V_L-V_H)/3$. The second predetermined periodic signal $S_2$ is chosen such that the falling edges are shifted by an amount that can be precisely achieved, i.e. one bit duration. As an example, the second predetermined periodic signal $S_2$ is 110110110 . . . , whose waveform periodically has two bit durations of high signal level and one bit duration of low signal level. According to FIG. 3, the characteristic value of the second predetermined periodic signal $S_2$, denoted by $V_{R2}$, should be $(V_H-V_L)/3$. Since the waveform of the first and second predetermined periodic signals ($S_1$ and $S_2$) can be generated very precisely, their corresponding characteristic values ($V_{R1}$ and $V_{R2}$) can thus be used as reference values for calculating the expected characteristic value $V_n$ corresponding to the delay parameter n. The expected characteristic value $V_n$ is thus used for calibrating the selection module 230 such that the delay time $DT_n$ can be close to its expected value, n*T.

Figure 4:
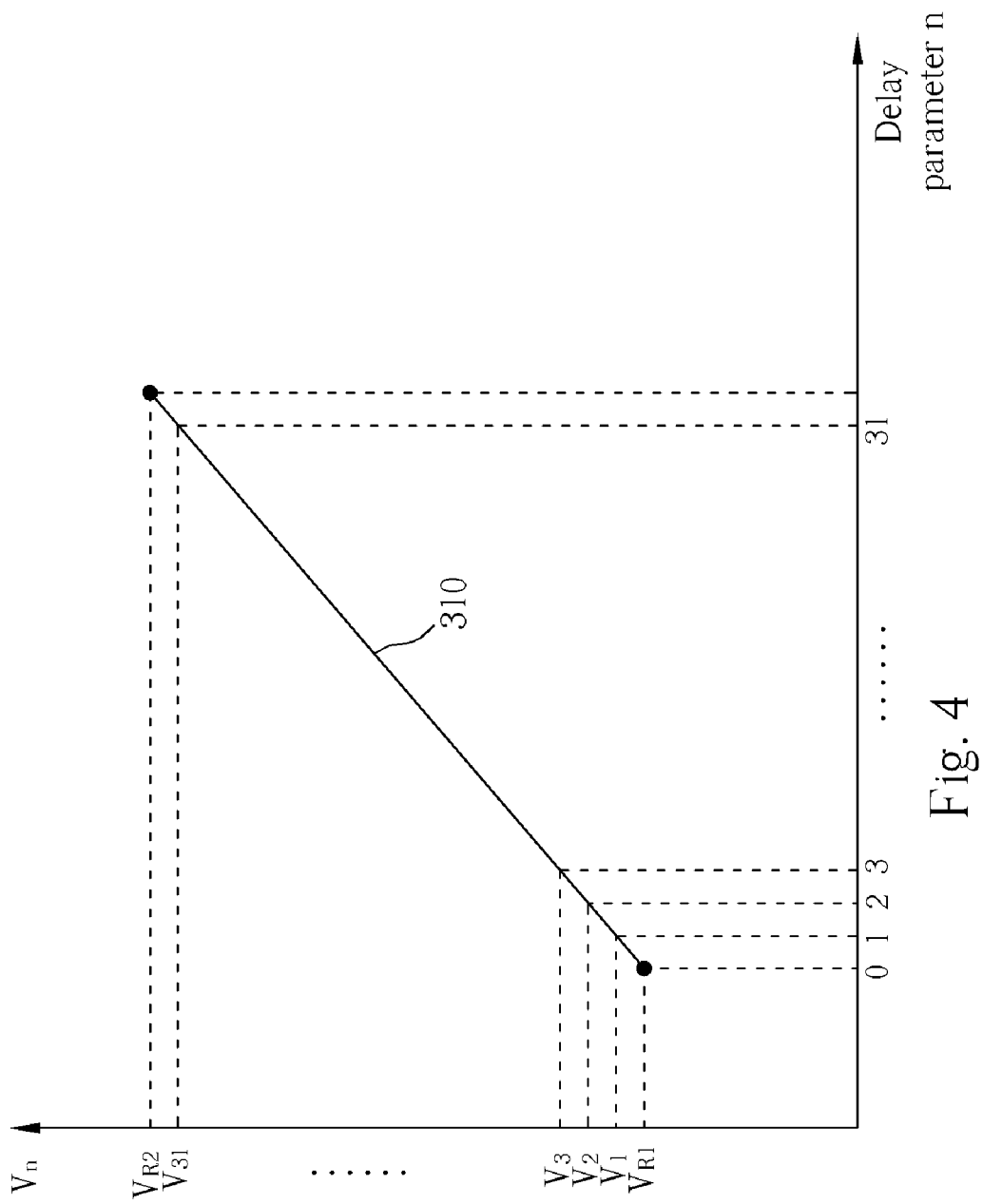
FIG. 4 is a functional block diagram showing the determination of expected characteristic value $V_n$ according to two reference values $V_{R1}$ and $V_{R2}$, and the delay parameter n.

According to these two reference values $V_{R1}$ and $V_{R2}$, the control module 280 can interpolate or extrapolate from them to calculate the expected characteristic value $V_n$ for delay parameter value n, n=1, . . . , N−1. FIG. 4 is a diagram showing the determination of expected characteristic value $V_n$ according to two reference values $V_{R1}$ and $V_{R2}$, and the delay parameter n for the case that N=32. According to the linear relationship shown by 310, the expected characteristic value $V_n$ is obtained by $V_n=V_{R1}+n*(V_{R2}-V_{R1})/N$, for n=1, 2, . . . , N−1.

After the first reference value $V_{R1}$, the second reference value $V_{R2}$ and the expected voltage value $V_n$ are obtained, the control module 280 could calibrate the control signal generator 235 of the selection module 230 from now on. For a specific delay parameter n, the first predetermined periodic signal $S_1$ is used as the input signal $S_{IN}$, the control signal generator 235 will generate the control signal CTRL with states toggling between $CTRL_0$ and $CTRL_K$ where K is obtained by looking the delay parameter n into the lookup table $T_{nK}$. In this case, the delay time $DT_n$ will equal to the delay amount introduced by the first K delay units 215 in the delay module 210. The corresponding phase-modified signal $S_{OUT}$ is formed by shifting the edges of the input signal $S_{IN}$ by the delay time $DT_n$. The edges of the input signal $S_{IN}$ can be falling edges. For another case, the edges of the input signal $S_{IN}$ can be rising edges. The phase-modified signal $S_{OUT}$ is fed to the measuring module 260 to obtain the corresponding characteristic value $V_A$.

The control module 280 is used to calibrate the parameter K corresponding to the delay parameter n stored in the control signal generator 235 to minimize the difference between the characteristic value $V_A$ of the phase-modified signal $S_{OUT}$ and the expected value $V_n$. For instance, when $V_A$ is greater than $V_n$, the control module 280 will decrease the value of K, i.e. decrease the value of K by one for each calibration iteration cycle, until the corresponding characteristic value $V_A$ is closest to the expected characteristic value $V_n$. On the other hand, when $V_A$ is less than $V_n$, the control module 280 will increase the value of K, i.e. increase the value of K by one for each calibration iteration cycle, until the corresponding characteristic value $V_A$ is closest to the expected characteristic value $V_n$.

Figure 5:
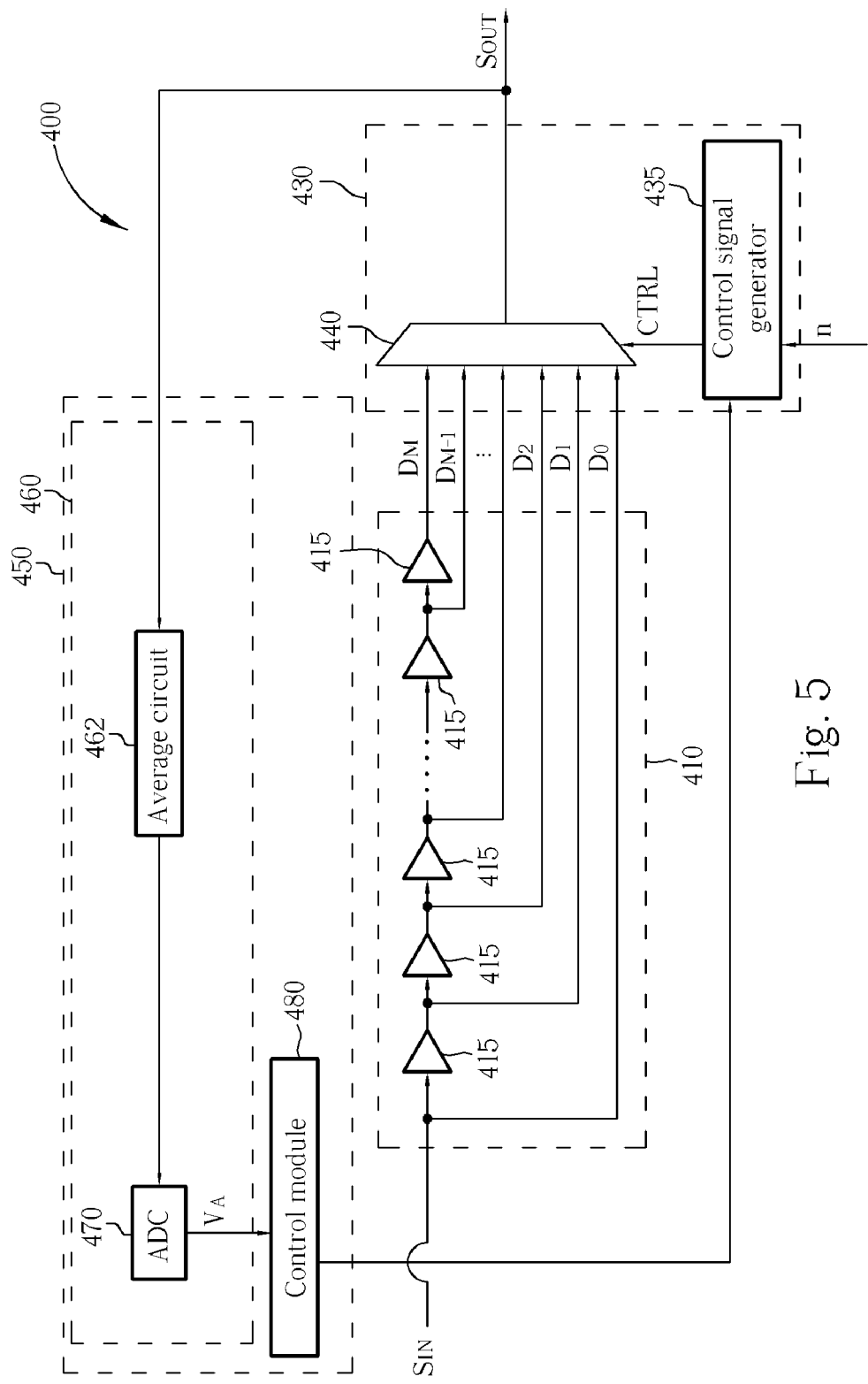
FIG. 5 is a functional block diagram showing a multiphase waveform generator capable of performing phase calibration according to the second embodiment of the present invention.

Please refer to FIG. 5. FIG. 5 is a functional block diagram showing a multiphase waveform generator capable of performing phase calibration according to the second embodiment of the present invention. Differentiated from the multiphase waveform generator 200 of FIG. 3, the measuring module 460 only includes an average circuit 462 (which can also be a low-pass filter) and an ADC 470. In spite of this difference, the operations of the two generators 200 and 400 are substantially the same. The circuitry of FIG. 5 is simpler than the one of FIG. 3, however the noise immunity of the phase measuring module 460 is worse than the one of the phase measuring module 260 in FIG. 3.

In addition to being implemented in an analog manner, it is recognized to a person skilled in the art that the measuring module in the present invention can also be implemented in a digital manner. For example, an ADC with high sampling frequency is used to sample the phase-modified signal $S_{OUT}$ and generate a sampled signal. The characteristic value is obtained by averaging the sampled signal. Nevertheless, this method will not be further discussed here since the fundamental principle of the method is relatively similar to the one described from FIG. 3.

Figure 6:
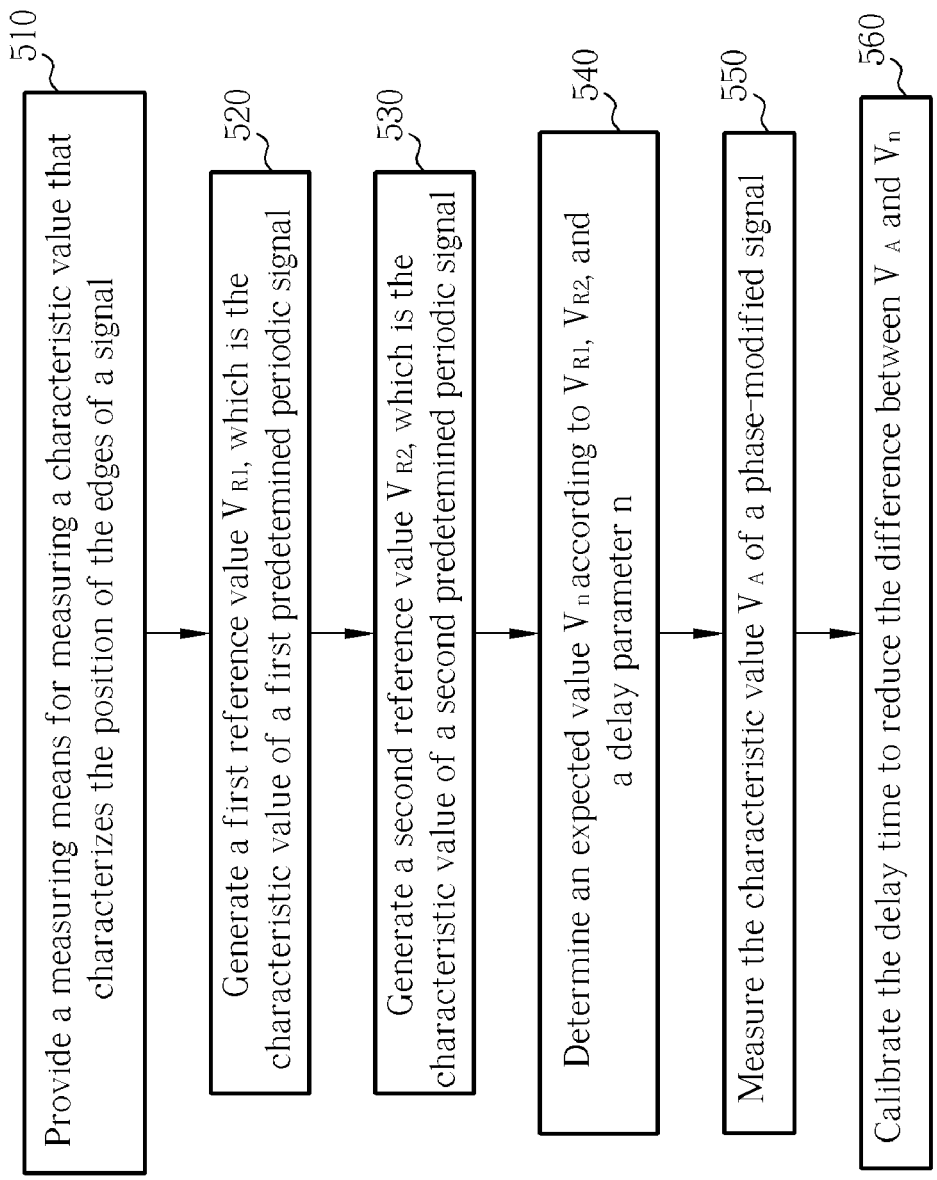
FIG. 6 is a flowchart diagram showing a phase calibration method of a multiphase waveform generator.

FIG. 6 is a flowchart diagram showing a phase calibration method of a multiphase waveform generator, wherein the multiphase waveform generator is utilized for receiving an first input signal $S_{IN}$ and a delay parameter n, outputting a phase-modified signal $S_{OUT}$ having edges respectively shifted by a delay time according to the delay parameter n. As shown in FIG. 6, the calibration method includes the following steps:

Step 510: Provide a measuring means for receiving a second input signal $S_{IN2}$ and measuring a characteristic value that characterizes the position of the edges of the second input signal $S_{IN2}$.

Step 520: Generate a first reference value $V_{R1}$ by letting the second input signal $S_{IN2}$ be a first predetermined periodic signal $S_1$ and measuring the characteristic value of the first predetermined periodic signal $S_1$.

Step 530: Generate a second reference value $V_{R2}$ by letting the second input signal $S_{IN2}$ be a second predetermined periodic signal $S_2$ and measuring the characteristic value of the second predetermined periodic signal $S_2$.

Step 540: Determine an expected characteristic value $V_n$ according to the first reference value $V_{R1}$ and the second reference value $V_{R2}$, and the delay parameter n.

Step 550: Measure the characteristic value $V_A$ of the phase-modified signal $S_{OUT}$ by letting the second input signal $S_{IN2}$ be the phase-modified signal $S_{OUT}$.

Step 560: Calibrate the delay time to reduce a difference between the characteristic value $V_A$ of the phase-modified signal $S_{OUT}$ and the expected value $V_n$.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A multiphase waveform generator comprising:
  a multiphase waveform generating module for receiving a first input signal and a delay parameter, shifting respective edges of the first input signal by a delay time according to the delay parameter to generate a phase-modified signal; and
  a calibrating module comprising:
    a measuring module for receiving a second input signal, measuring a characteristic value that characterizes the position of the edges of the second input signal; and
    a control module electrically connected to the measuring module for calibrating the delay time to reduce a difference between a characteristic value of the phase-modified signal and an expected characteristic value;
  wherein the measuring module generates the characteristic value of the phase-modified signal using the phase-modified signal as the second input signal, the control module stores a first reference value which is generated by the measuring module using a first predetermined periodic signal as the second input signal, the control module stores a second reference value which is generated by the measuring module using a second predetermined periodic signal as the second input signal, and the expected characteristic value is calculated according to the first and second reference values, and the delay parameter.

2. The multiphase waveform generator of claim 1, wherein the measuring module comprising:
  an average circuit for receiving the second input signal and generating an average signal of the second input signal; and
  an analog to digital converter for digitizing the average signal of the second input signal to output the characteristic value of the second input signal.

3. The multiphase waveform generator of claim 2, wherein the average circuit is a low-pass filter.

4. The multiphase waveform generator of claim 1, wherein the measuring module comprises:
  a first average circuit for receiving the second input signal and generating an average signal of the second input signal;
  an inverter for receiving the second input signal and generating an inverted signal;
  a second average circuit electrically connected to the inverter for generating an average signal of the inverted signal;
  a subtracter electrically connected to the first average circuit and the second average circuit for generating a difference between the average signal of the second input signal and the average signal of the inverted signal; and
  an analog to digital converter electrically connected to the subtracter for digitizing the difference to output the characteristic value of the second input signal.

5. The multiphase waveform generator of claim 4, wherein the first average circuit and the second average circuit are both low-pass filters.

6. The multiphase waveform generator of claim 1, wherein the first and second predetermined periodic signal have the same period but different duty cycle.

7. The multiphase waveform generator of claim 6, wherein the first input signal is the first predetermined periodic signal, the expected characteristic value equals to $V_{R1}+n*(V_{R2}-V_{R1})/N$ where $V_{R1}$ is the first reference value, $V_{R2}$ is the second reference value, n is an integer denoting the delay parameter, and N is a preset integer.

8. The multiphase waveform generator of claim 1, wherein the edges of the first input signal shifted by the multiphase waveform generating module are falling edges.

9. The multiphase waveform generator of claim 1, wherein the edges of the first input signal shifted by the multiphase waveform generating module are rising edges.

10. A method for calibrating a multiphase waveform generator, wherein the multiphase waveform generator is utilized for receiving an first input signal and a delay parameter, outputting a phase-modified signal having edges respectively shifted by a delay time according to the delay parameter, the method comprising:
  providing a measuring means for receiving a second input signal and measuring a characteristic value that characterizes the position of the edges of the second input signal;
  generating a first reference value by letting the second input signal be a first predetermined periodic signal and measuring the characteristic value of the first predetermined periodic signal;
  generating a second reference value by letting the second input signal be a second predetermined periodic signal and measuring the characteristic value of the second predetermined periodic signal;

determining an expected characteristic value according to the first and second reference values, and the delay parameter;

measuring the characteristic value of the phase-modified signal by letting the second input signal be the phase-modified signal; and calibrating the delay time to reduce a difference between the characteristic value of the phase-modified signal and the expected characteristic value.

11. The method of claim 10, wherein the characteristic value of the second input signal equals to an average signal of the second input signal.

12. The method of claim 10, wherein the characteristic value of the second input signal equals to a difference between an average signal of the second input signal and an average signal of an inverted version of the second input signal.

13. The method of claim 10, wherein the step of calibrating the delay time is performed until the characteristic value of the phase-modified signal is closest to the expected characteristic value.

14. The method of claim 10, wherein the edges of the first input signal shifted by the multiphase signal waveform generator are rising edges.

15. The method of claim 10, wherein the edges of the first input signal shifted by the multiphase signal waveform generator are falling edges.

16. The method of claim 10, wherein the first and second predetermined periodic signal have the same period but different duty cycle.

17. The method of claim 16, wherein the first input signal is the first predetermined periodic signal, the expected characteristic value equals to $V_{R1}+n*(V_{R2}-V_{R1})/N$ where $V_{R1}$ is the first reference value, $V_{R2}$ is the second reference value, n is an integer denoting the delay parameter, and N is a preset integer.

* * * * *